July 9, 1974 J. J. DI FAZIO ET AL 3,823,016

PHOTOMASK REPAIR PROCESS

Filed May 3, 1973 3 Sheets-Sheet 1

July 9, 1974 J. J. DI FAZIO ET AL 3,823,016

PHOTOMASK REPAIR PROCESS

Filed May 3, 1973 3 Sheets-Sheet 3

3,823,016

PHOTOMASK REPAIR PROCESS

James Joseph Di Fazio and George Joseph Giuffre, Wappingers Falls, and James Rodney Zingerman, Pine Bush, N.Y., assignors to International Business Machines Corporation, Armonk, N.Y.

Filed May 3, 1973, Ser. No. 356,862
Int. Cl. G03c 5/00
U.S. Cl. 96—38.3 5 Claims

ABSTRACT OF THE DISCLOSURE

Defects in exposure masks used in integrated circuit manufacture are corrected during the development process. A silver halide emulsion is exposed to form a latent image of a circuit pattern. The emulsion is partially developed and is then observed under a microscope using red safe-light illumination. The areas which should have been exposed but were not; due, for example, to the presence of dirt particles, are visually located as showing red against a black or gray background. These areas are then selectively exposed, and the development of the emulsion is completed.

BACKGROUND OF THE INVENTION

This invention relates generally to the formation of photographic images and more specifically to the formation of exposure masks used in the manufacture of integrated circuits.

Exposure masks having extremely fine geometry are employed in the manufacture of microminiaturized integrated circuits. The masks are used to expose in a patternwise manner a layer of light sensitive resist material so that a relief pattern image of resist can be formed on the surface of a semiconductor substrate. The exposure masks must be free from defects which would cause holes or unwanted geometry to occur in the resist image. Such defects in the resist image would result in a reduced yield of operable integrated circuit devices.

One typical mask making process uses an artwork generator. In this process a light sensitive plate such as a layer of silver halide emulsion coated on a glass substrate is exposed in small increments by a computer controlled mask generator to form a single segment or chip pattern. A large number of exposures are required and the exposure time to expose the entire plate can be a matter of hours. Even in a class 100 clean room environment, it has been found that defects occur because of dirt particles which interfere with the proper exposure of the plate. These defects show up as clear areas in a positive development process and opaque areas in a negative development process. These defects account for about 95% of the total number of defects in the mask generation process. Because these defects occur despite clean concept precautions, a mask repair process is necessary.

One such repair process is described in co-pending application entitled "Latent Image Mask Repair," Ser. No. 307,692, filed Nov. 17, 1972 which application is assigned to the assignee of this application. According to the process of application Ser. No. 307,692, a visible latent image is formed prior to development of a final image such as by the use of a diazo type material which changes color upon exposure. The latent image is then repaired prior to development by selective additional exposures. Because diazo type material has a much slower photographic speed than silver halide emulsions, from a practical standpoint, it is usually necessary to contact expose the diazo material using a defective emulsion mask obtained from the mask generation process rather than generating and correcting the diazo type mask directly. We have now found a new process which permits the direst correction of a computer generated emulsion mask with a consequent saving in time and processing steps.

BRIEF SUMMARY OF THE INVENTION

In accordance with this invention, an exposure mask is formed by the steps of exposing imagewise a light sensitive layer to form a latent image; partially developing the image such that the image is visible but such that the layer retains its light sensitivity; visually locating the unexposed defect areas; selectively exposing the defect areas; and completing the development of the image.

DESCRIPTION OF THE DRAWING

The foregoing and other objects, features and advantages of the invention will be apparent from the following more particular description of preferred embodiments of the invention as illustrated in the accompanying drawings.

DETAILED DESCRIPTION

Figure 1:
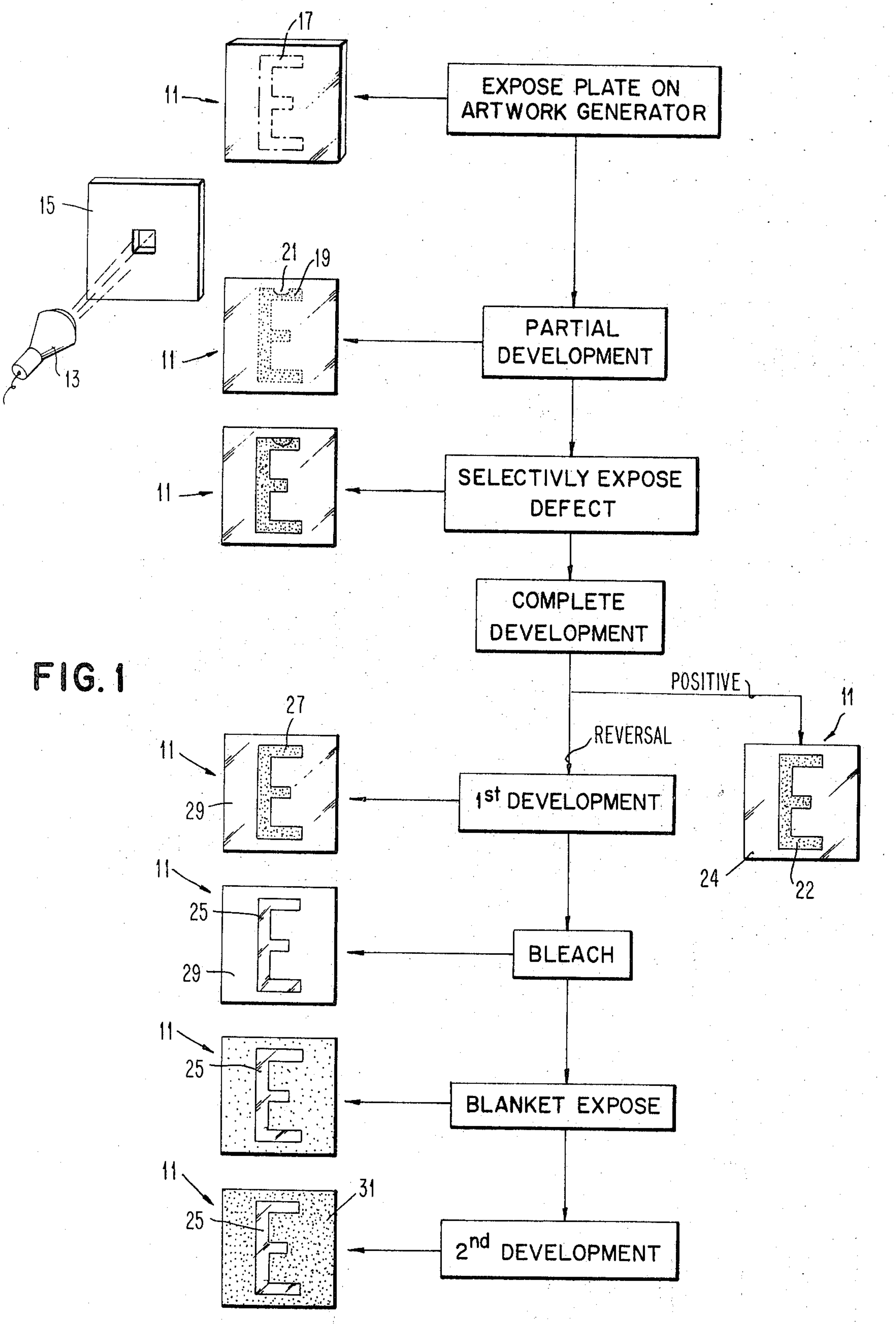
FIG. 1 is a flow chart illustrating an embodiment of the process of the invention for carrying out either normal (positive) or reversal development.

Turning now to FIG. 1, a light sensitive plate 11 is exposed stepwise with a light source 13 through a variable aperture plate 15 of a computer controlled artwork generator of the type, for example, manufactured by the D. W. Mann Company.

The light sensitive plates used in photolithographic mask making are typically comprised of a layer of fine grained silver halide particles emulsified in a binder coated on a glass substrate, for example, those marketed under the trademark, Kodak HRP, by the Eastman Kodak Company. The silver halide emulsion layer when exposed and developed in a positive manner, gives a black image of silver in the light struck areas.

The unexposed silver halide is removed to provide transparent windows in the substrate. The exposures produce a latent image 17 represented for the sake of simplicity by the dotted line block E in the figure. It should be understood that the images for use in photolithographic processes will be more complex such as, for example, a microminiaturized integrated circuit device pattern. The latent image is partially developed such that it becomes visible as illustrated at 19. This partial development is accomplished using conventional developers but stopping the development short of completion. Suitable developers include, for example, Kodak HRP* or Kodak D19* developers which are of the Elon-hydroquinone type. The formularies of such developers are listed in manufacturer's brochures and, for example, in the Handbook of Chemistry and Physics, 42nd edition, page 3308. Kodak HRP* developer diluted 1 to 4 with water as recommended by the manufacturer can be employed with a development time of 30 seconds at 68° F. The development is stopped by immersing the plate in deionized water for 1 minute. The development could be continued for a longer time up to about 2½ minutes without adversely affecting the correcting process but it has been found that the development for about 30 seconds or such that the image is just visible to the naked eye is completely satisfactory. The plate is then dried by a series of methanol rinses using, for example, the following methanol and methanol/deionized water solutions for 15 seconds each; 50/50, 75/25, 100% methanol and 100% methanol. The plate is dried for 2 minutes in a nitrogen atmosphere. The partially developed and dried plate is then pre-inspected

Figure 2:
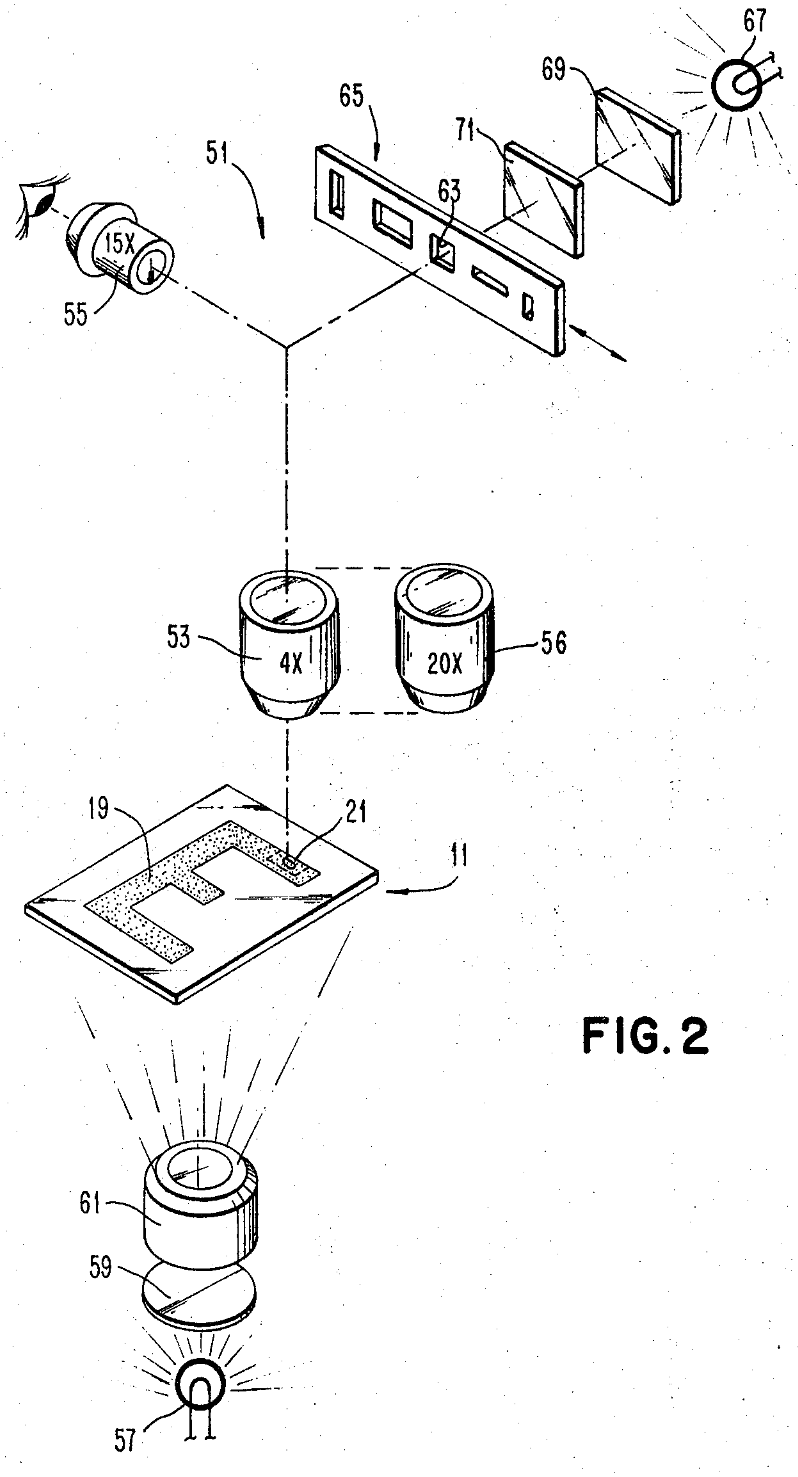
FIG. 2 is a highly schematic isometric view of a suitable repair tool for use in the process of the invention.

*Tradmark of Eastman Kodak Company.

under a microscope for obvious data errors and gross clear defect counts using a safe-lighted Bausch and Lomb stereo-zoom microscope. Following the pre-inspection and the determination that the plate is satisfactory except for clear defects the segment is placed on the stage of a rework tool. Rework tool 51 is schematically illustrated in FIG. 2 and is a modified dual illumination microscope. Using a 4× objective 53 and a 15× eyepiece 55, the plate 11 is inspected for clear anomalies. The clear defects show up as red on a black or gray background using the transmitted light from a tungsten light source 57 which is passed through a sub-stage condenser 61 which is fitted with a 6,000 A. red filter 59. The sub-stage condenser is placed at the lowest position to allow for maximum light divergence. This diffuse light condition is sufficient to prevent further exposure of the emulsion. When a defect is observed such as at 21, a 20× objective 56 is put in place to give a total magnification of 420× and an appropriate aperture 63 contained in aperture slide 65 is selected and positioned to cover the area of the defect. Minimum and maximum effective apertures range from about 70 microinches to about 4 mils with interchangeable slides being provided to coincide with the various size geometries of the image 19 to be repaired, i.e., 10×, 5× or 1×, for example. The repair is accomplished by passing exposing radiation through the selected aperture. The exposing radiation is from a tungsten light source 67 which is equipped with a 6,000 A. red filter 69 and a 6907 A. narrow band filter 71. The two filters are employed to provide illumination for correctly choosing and positioning the aperture. When the appropriate aperture is selected and positioned, the narrow band filter 71 is removed and the radiation passed by the remaining filter 69, which radiation is greatly concentrated by the microscope optics is sufficent to expose the clear defect area 21. Nominal exposure times of about 10 seconds are employed. All clear defects are exposed as outlined above. It should be understood that the particular light source and filter combination are shown for illustration only and that other arrangements which permit prealignment without exposure and then selective exposure of the defect areas can be used.

Upon completion of the selective exposure repair process, the plates are then processed in a conventional manner to complete the development of the image. FIG. 1 illustrates both positive and reversal development as is conventional in the art. In the conventional positive development process, the plates are placed in a developer solution such as is used for the partial development for about 5 minutes followed by rinsing in a water stop bath and then fixing to provide an opaque image 22 on a transparent background 24. Alternatively, the reversal development process is employed in order to form a clear image 25 on an opaque silver background area 31. The normal development is carried out to form image 27 without disturbing the remaining emulsion, and the silver image is removed by a bleaching step. The remaining emulsion layer 29 is then blanket exposed and developed to form opaque area 31. Such a reversal development process is conventional and a suitable process is described, for example, on page 6 of Kodak pamphlet No. P–47.

Figure 3:
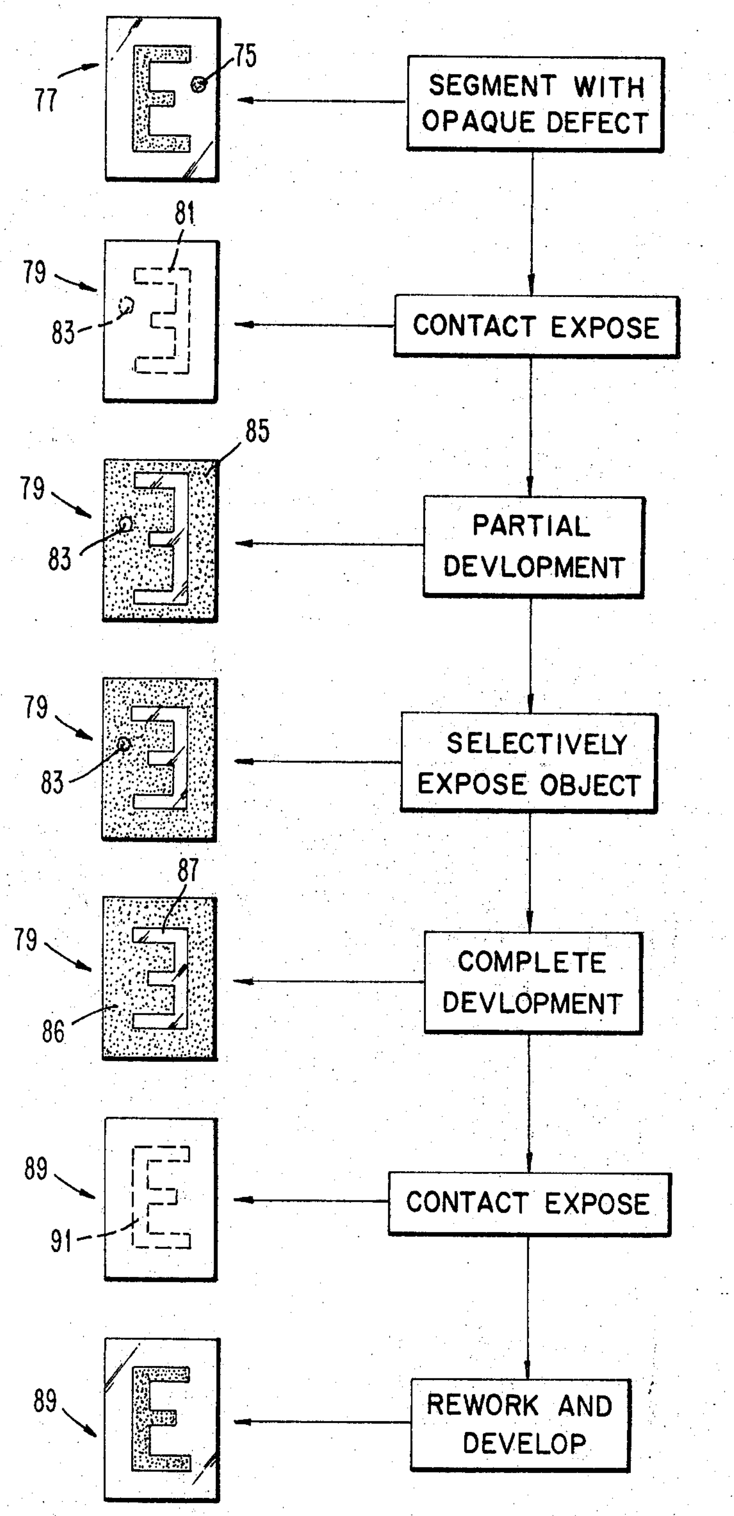
FIG. 3 is a flow chart illustrating an embodiment of the invention in which opaque defects are repaired.

FIG. 3 illustrates an embodiment of the invention in which the process is employed to correct an opaque defect 75 on a positive image plate 77. Plate 77 is used to contact expose a fresh plate 79 to form the latent image 81 and latent defect 83. The plate is then partially developed so that defect 83 appears as a clear area in exposed, partially developed, area 85. Defect 83 is then located and selectively exposed using rework tool 51. The development of area 85 is completed to form the clear area 87 corresponding to the originally unexposed image area 81 on an opaque background 86. Plate 79 is then used to contact expose a fresh emulsion plate 89 to form exposed latent image 91. This latent image 91 is then inspected for any new clear defects and such defects are reworked in accordance with the process of the invention. Completion of the development produces the final corrected plate 89 with the opaque defect 75 being absent.

While the invention has been particularly shown and described with reference to preferred embodiments thereof, it will be understood by those skilled in the art that the foregoing and other changes in form and details may be made therein without departing from the spirit and scope of the invention.

We claim:

1. A process for forming an exposure mask comprising the steps of exposing imagewise a light sensitive siliver halide emulsion layer coated on a transparent substrate to form a latent image, partially developing the image such that the image is visible but such that the layer retains its light sensitivity, visually locating the unexposed defect areas, selectively exposing the defect areas, completing the development of the image to form an opaque silver image, and removing the unexposed portions of the emulsion layer to form transparent areas.

2. The process according to Claim 1 wherein the imagewise exposure of the light sensitive silver halide emulsion layer is by exposure to a positive photomask containing an opaque defect and following the steps of partial development of the image, exposure of the defect areas including the clear area resulting from the original opaque defect, and completion of the exposure mask which is a negative of the mask used for the exposure; the completed mask is used to expose a fresh light sensitive layer contained on a transparent substrate which layer is developed to form a positive exposure mask without said opaque defect.

3. A process for forming an exposure mask comprising the steps of exposing imagewise a light sensitive layer of a silver halide emulsion coated on a transparent substrate to form a latent image, partially developing the image such that the image is just visible, visually locating the unexposed defect areas, selectively exposing the defect areas, and completing the mask by removing the light sensitive layer from either the exposed or unexposed portions to form transparent areas and forming an opaque silver layer in the remaining portions.

4. The process of claim 3 wherein said mask is completed by reducing the emulsion layer to silver in the exposed image areas and then removing the unexposed emulsion layer to form the transparent areas.

5. The process of Claim 3 wherein said mask is completed by reducing the emulsion layer to silver in the exposed image areas, bleaching the silver layer to form transparent areas, blanket exposing the remaining light sensitive layer, and developing the blanket exposed layer to form opaque silver areas.

References Cited

UNITED STATES PATENTS

| | | | |
|---|---|---|---|
| 3,647,445 | 3/1972 | Burns | 96—35 |
| 3,317,320 | 5/1967 | Reber | 96—36.2 |
| 3,598,604 | 8/1971 | Depuy | 96—44 |
| 3,536,407 | 10/1970 | Sandlin | 96—27 R |
| 3,450,532 | 6/1969 | Fichter | 96—27 R |

RONALD H. SMITH, Primary Examiner

E. C. KIMLIN, Assistant Examiner

U.S. Cl. X.R.

96—27 R, 44, 48 R